United States Patent [19]

Hutson

[11] 4,067,041

[45] Jan. 3, 1978

[54] SEMICONDUCTOR DEVICE PACKAGE AND METHOD OF MAKING SAME

[76] Inventor: Jearld L. Hutson, P.O. Box 34235, Dallas, Tex. 75234

[21] Appl. No.: 617,443

[22] Filed: Sept. 29, 1975

[51] Int. Cl.² .................... H01L 23/48; H01L 39/02; H01L 23/02
[52] U.S. Cl. .................................. 357/80; 357/68; 357/69; 357/81
[58] Field of Search .................. 357/80, 81, 68, 69

[56] References Cited

U.S. PATENT DOCUMENTS

| | | | |
|---|---|---|---|
| 3,763,403 | 10/1973 | Lootens | 357/81 |
| 3,829,598 | 8/1974 | Darnell | 357/81 |
| 3,864,727 | 2/1975 | Schoberl | 357/81 |
| 3,967,296 | 6/1976 | Intrator | 357/80 |

*Primary Examiner*—Edward J. Wojciechowicz

*Attorney, Agent, or Firm*—Richards, Harris & Medlock

[57] ABSTRACT

The specification discloses a semiconductor device package which includes a conductive heat sink support member which is bonded to a planar face of a ceramic body. A conductive pattern is formed on a second planar face of the ceramic body and includes at least two discrete pattern portions. A semiconductor switching device has at least first and second terminals on one side and a third terminal on the other side. The semiconductor switching device is bonded on the one side to the conductive pattern, with the first and second terminals contacting the two discrete portions of the conductive pattern. First and second conductive leads are bonded to the two discrete portions of the conductive pattern adjacent to the semiconductor switching device and extend outwardly from the ceramic body. A third conductive lead is bonded to the third terminal on the other side of the semiconductor device.

14 Claims, 13 Drawing Figures

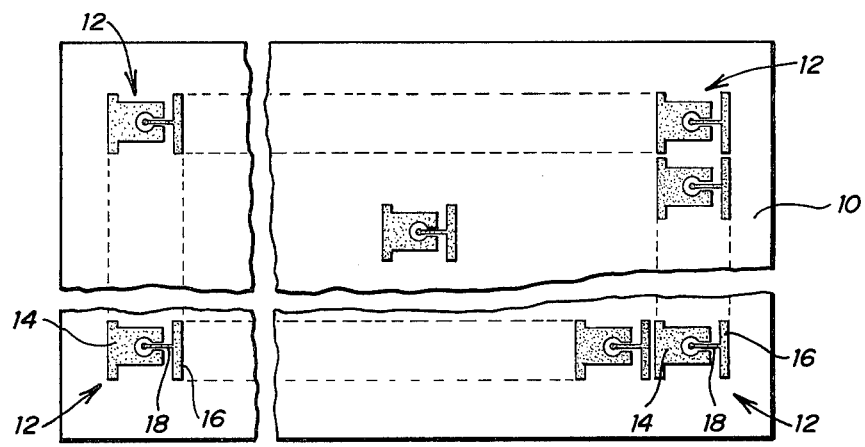
FIG. 1
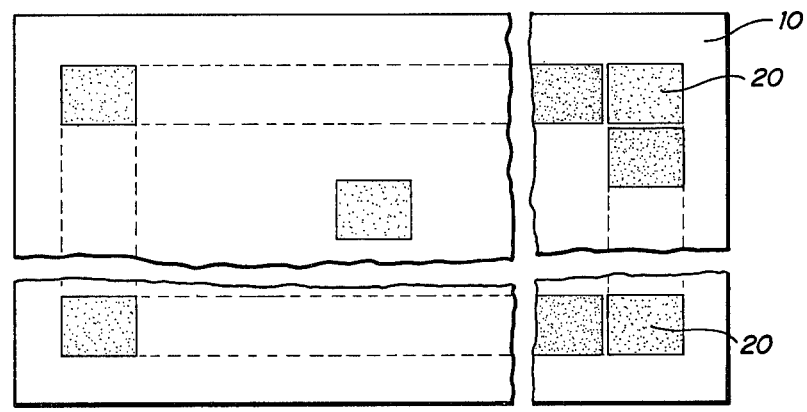
FIG. 2
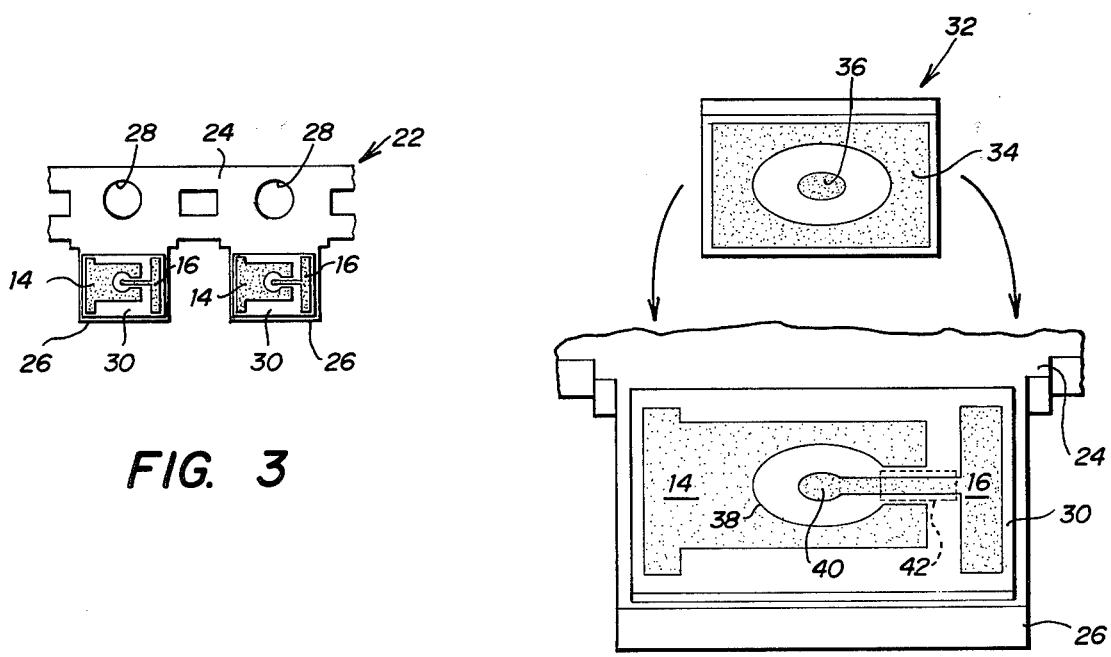
FIG. 3
FIG. 4

SEMICONDUCTOR DEVICE PACKAGE AND METHOD OF MAKING SAME

FIELD OF THE INVENTION

This invention relates to semiconductor devices, and more particularly relates to a package for a semiconductor device and the method of making the package.

THE PRIOR ART

An important aspect of fabricating semiconductor devices is the attachment of the semiconductor device to a mounting structure and the final packaging of the mounted device. With such semiconductor devices as SCR's, triacs and transistors, many previously developed packaging techniques have required mounting of the devices on a support member and then separately attaching two or more leads to the exposed upper face of the device.

It has thus been proposed that such multiterminal semiconductor devices be attached to their support housings by "flip-chip" mounting or face bonding. In this technique, the semiconductor device is mounted face down on its support substrate, thereby reducing fabrication costs since connection bonds between the device terminals and the substrate may be made simultaneously. Techniques of flip-chip mounting have included the use of solder coated balls between the semiconductor device and the substrate, and also included beam lead bonding, but these techniques have been costly and have increased surface area required for mounting. Still other flip-chip techniques have incorporated raised metallic bumps on the semiconductor device terminals, but bonding to the substrate with this technique requires alignment and bonding with thermocompression or ultrasonic techniques.

It has thus been heretofore proposed to eliminate some of the problems of the prior art flip-chip mounting techniques by forming conductive patterns on the ceramic substrate and bonding a semiconductor device to the pattern. However, such prior attempts have not been successfully accomplished and have often resulted in the imposition of mechanical stresses on the semiconductor device through leads attached to the ceramic substrate and to the semiconductor device.

SUMMARY OF THE INVENTION

In accordance with the present invention, a technique has been provided for forming a semiconductor device package which incorporates ease of handling, simplicity of fabrication and proven reliability of the resulting package, without the imposition of mechanical stresses to the package through the attached leads.

In accordance with the present invention, a semiconductor device package includes a metal heat sink support member bonded to one side of a ceramic electrical insulating body. First and second spaced apart conductive patterns are formed on a second side of the ceramic body. A semiconductor switching device has first and second terminals on one side and a third terminal on the other side. The switching device is bonded on one side to the conductive patterns, with the first and second terminals bonded to the first and second conductive patterns. A first lead is bonded to the first conductive pattern and a second lead is bonded to the second conductive pattern. The first and second leads are located adjacent to, but spaced from, the switching device so as to isolate the switching device from mechanical stresses imposed on the leads.

In accordance with another aspect of the invention, a semiconductor device package includes a conductive heat sink support member. An electrically nonconductive body having two opposed planar faces is bonded to the support member on one of the planar faces. A conductive pattern is formed on the other of the planar faces of the body and includes at least two discrete pattern portions. A semiconductor device has at least first and second terminals on one side and a third terminal on the other side. The semiconductor device is bonded on the one side to the conductive pattern with the first and second terminals contacting the two discrete portions of the conductive pattern. First and second conductive leads are bonded to the two discrete portions of the conductive pattern adjacent to the semiconductor device and extend outwardly from the nonconductive body. A third conductive lead is bonded to the third terminal on the other side of the semiconductor device.

In accordance with another aspect of the invention, a method of packaging a semiconductor device includes forming at least two conductive patterns on a first planar face of a ceramic body. A metal heat sink member is then bonded to a second planar face of the ceramic body. Two terminals on one face of a semiconductor device are then bonded to areas of the conductive portions. Two leads are bonded to other areas of the conductive pattern such that two leads are spaced from the semiconductor device to isolate the device from mechanical stresses imposed upon the leads. A third lead is bonded on a third terminal on a second face of the semiconductor device. The ceramic body, semiconductor device and portions of the leads are encapsulated to form a semiconductor package with the leads extending therefrom.

DESCRIPTION OF THE DRAWINGS

For a more detailed description of the present invention and for other aspects and advantages thereof, reference is made to the following description taken in conjunction with the accompanying drawings, in which:

FIG. 1 is a top view of a ceramic body having a plurality of conductive patterns formed thereon;

FIG. 2 is a view of the back side of a ceramic body shown in FIG. 1 illustrating the formation of additional conductive patterns thereon;

FIG. 3 is a top view of a tab frame with two ceramic bodies attached thereto;

FIG. 4 is a pictorial perspective view of the ceramic substrate about to be attached to a face of a semiconductor switching device;

DESCRIPTION OF THE PREFERRED EMBODIMENT

Figure 5:
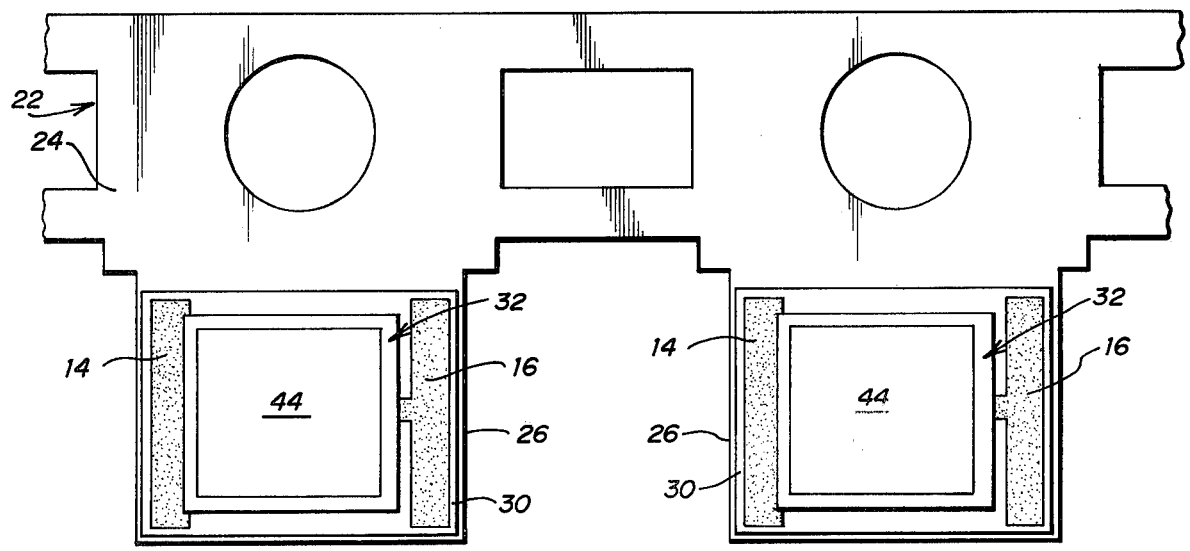
FIG. 5 is a top view of the attached assembly shown in FIG. 4.

FIG. 1 illustrates a ceramic body 10 having opposed planar sides and having a plurality of conductive patterns 12 formed thereon. Each of the conductive patterns 12 includes a first pattern portion 14 and a second spaced apart pattern portion 16. Pattern portions 14 and 16 are interdigitated, with an extension 18 extending from portion 16 into a cavity formed in portion 14. Pattern portions 14 and 16 are configured to correspond with the gate and cathode terminals of a semiconductor switching device such as an SCR. In construction, as many as eighty of the conductive patterns 12 will be symmetrically formed on one side of the ceramic body 10.

FIG. 2 illustrates a view of the back of the ceramic body 10, illustrating a plurality of rectangular conductive patterns 20 formed symmetrically thereon. Conductive patterns 20 correspond in placement with the position of a conductive pattern 12 on the opposite side.

The ceramic body 10 may be formed from any of the various ceramic materials which are commonly employed in the manufacture of electronic components, but preferably comprise a ceramic wafer formed from alumina ($Al_2O_3$), beryllium oxide (BeO) or boron nitride (BN). Beryllium oxide in particular is useful in the fabrication of the ceramic body 10 due to its superior terminal conductivity characteristics.

The dimensions of the ceramic body 10 are not critical to the practice of the invention, but may comprise for example a thin rectangular wafer having dimensions of approximately $2 \times 2 \times .02$ inches.

The conductive patterns 12 and 20 are formed in accordance with the technique disclosed and claimed in U.S. Pat. No. 3,829,593 and entitled "COPPER HEAT SINKS FOR ELECTRONIC DEVICES AND METHOD OF MAKING SAME", issued Aug. 13, 1974. Specifically, molybdenum-manganese is applied on the base of the conductive patterns by means of silk screening or the like. The ceramic wafer and the molybdenum-manganese layers are then baked at about 1,300° C. in a hydrogen atmosphere. Subsequently, a layer of material containing copper is applied to each of the molybdenum-manganese bonding layers in accordance with the teachings of U.S. Pat. No. 3,829,598. The copper is then heated to fuse the copper or sinter the copper into a discrete conductive pattern comprising substantially elemental copper so as to provide maximum heat transfer, ductility and conductivity.

After the ceramic body 10 has been processed to form the conductive patterns 12 and 20 on opposite faces thereof, the ceramic body 10 is then severed into a plurality of components as by scribing or the like. Each resulting ceramic body is then bonded to a portion of a tab frame 22 as shown in FIG. 3. Tab frame 22 is preferably formed from a highly conductive metal and serves as a heat sink for the semiconductor package, as will be subsequently described. The tab frame 22 includes an elongated portion 24 with generally rectangular heat sink tabs 26 formed at spaced intervals therealong. The tab frame 22 is formed with a substantial length and may include ten or more tabs 26 along the length thereof.

Apertures 28 are formed at spaced locations along the tab frame 22 in order to enable attachment of the package to a large heat sink as will be subsequently described.

As shown in FIG. 3, ones of the ceramic bodies 30 which are formed by severing the ceramic body 10 are bonded to the tabs 26 by soldering of the conductive patterns 20 to the tabs 26. Thus, the conductive patterns 14 and 16 are exposed on each tab 26 in the manner shown.

FIG. 4 illustrates the mounting of a semiconductor device 32 upon the ceramic body 30. While it will be understood that the semiconductor device 32 may comprise any of a plurality of various types of semiconductor devices, in the preferred embodiment, the device 32 comprises a switching device, with a SCR being illustrated. The semiconductor device 32 includes a main terminal 34 and a center gate 36 spaced apart from one another in the well known manner.

The pattern portions 14 and 16 are interdigitated, with the concave portion 38 receiving an extruding projection 40. The extending portion 40 is dimensioned to contact the center gate 36. A layer 42 of insulating material such as glass or the like is formed over a portion of the extending portion 40 in order to prevent contact with the main terminal 34. Main terminal 34 of the device 32 will then contact only pattern portions 14. In fabrication of the package, solder is placed on the pattern portions 14 and 16 and the semiconductor device 32 is placed face down as shown in FIG. 4.

FIG. 5 illustrates a top view of a semiconductor device 32 when properly positioned on the ceramic body 30. It will of course be understood that a plurality of semiconductor devices 32 are simultaneously placed on a plurality of ceramic bodies 30 extending along the tab frame 22. The semiconductor device 32 includes a second main terminal 44 which is exposed when the device is mounted on the ceramic body 30. The illustrated configuration of FIG. 5 is then heated in order to melt the solder between the semiconductor device 32 and the conductive portions 14 and 16 in order to firmly bond the semiconductor device 32 to the ceramic body 30. As will be subsequently described, the solder used to bond the device 32 to the body 30 has a relatively high melting point and may comprise for example 90% lead and 10% tin.

Figure 6:
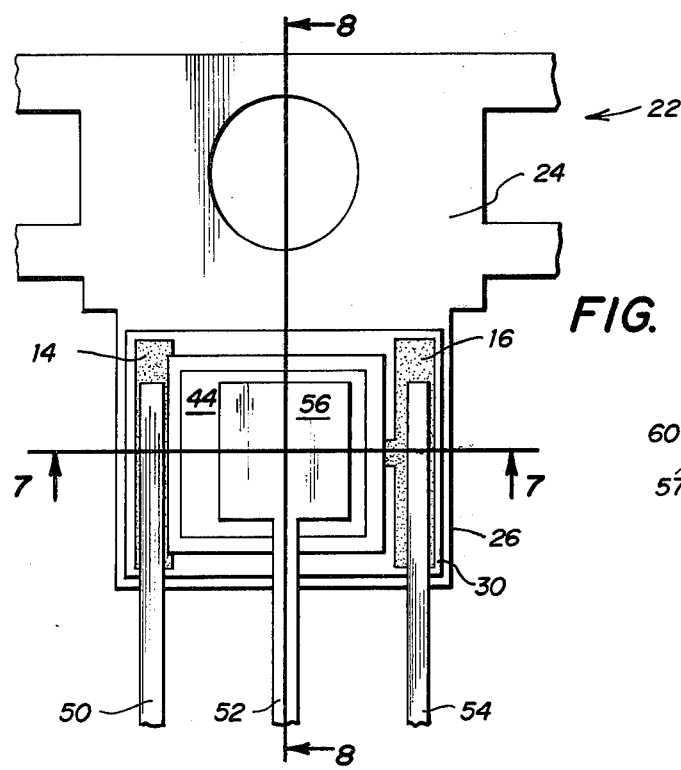
FIG. 6 is a top view of the assembly shown in FIG. 5 with the addition of three leads.

FIG. 6 illustrates the next step in assemblying the present package, with like numerals being utilized for like and corresponding parts shown in the previous drawings. At this stage, three metallic conductive leads 50, 52 and 54 are bonded to the assembly. Lead 50 is bonded to the pattern portion 14, while lead 54 is bonded to pattern portion 16. Lead 52 includes an enlarged pad portion 56 which is bonded to the second main terminal 44 of the semiconductor device 32.

Figure 7:
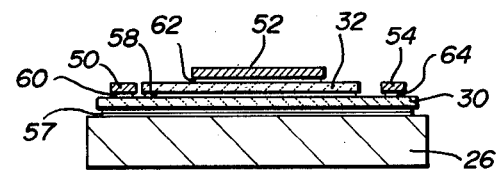
FIG. 7 is a sectional view taken through section lines 7—7 in FIG. 6.

FIG. 7 is a sectional view of the device shown in FIG. 6 taken generally along the section lines 7—7. FIG. 7 illustrates the layer of solder 57 which bonds the ceramic body 30 to the heat sink tab 26. The solder layer 58, previously described, bonds the semiconductor device 32 to the ceramic body 30. Solder layers 60, 62 and 64 bond the leads 50, 52 and 54 to the assembly.

In the preferred embodiment, the solder layers 60, 62 and 64 are provided with a lower melting point than the solder used for solder layer 58. Thus, when the leads 50, 52 and 54 are applied and heated to provide bonding, the previously soldered layer 58 will not remelt and cause shorting. Solder layers 60, 62 and 64 may comprise for example 60% tin and 40% lead or the like. If desired, the solder for layer 58 may comprise a hard solder comprised of gold-germanium or copper-silver bronze, or including the elements aluminum, platinum, gold, silver or cadmium.

Figure 8:
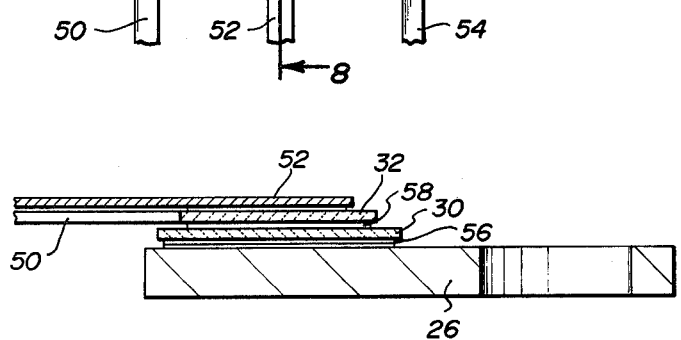
FIG. 8 is a sectional view taken generally along the section lines 8—8 in FIG. 6.

FIG. 8 illustrates a sectional view of the device of FIG. 6 taken generally along the section lines 8—8. FIGS. 7 and 8 illustrate that the lead 52 is bonded to the top of the semiconductor device 32, while leads 50 and 54 are bonded directly to the ceramic body 30 on opposite sides of semiconductor device 32. Thus, mechanical stresses imposed upon leads 50 and 54 are not transmitted directly to the semiconductor device 32, and thus the semiconductor device 32 is isolated from such external mechanical forces. This creates a much stronger and long lasting semiconductor package. In addition, the package shown in FIGS. 1–8 provides less component parts than previously developed packages and correspondingly less numbers of fabrication steps. In addition, the present packaging devices may be accomplished simultaneously on a large number of devices to further facilitate economic fabrication.

Referring to FIG. 8, in an alternate embodiment of the invention, a small bend or "wrinkle" (not shown) may be provided in lead 52 a short distance away from the semiconductor device 32, in order to prevent mechanical stresses from being imposed through lead 52 to the semiconductor device 32. When such aa bend or wrinkle is utilized, lead 52 may be formed from a low expansion alloy such as Kovar or the like.

Figure 9:
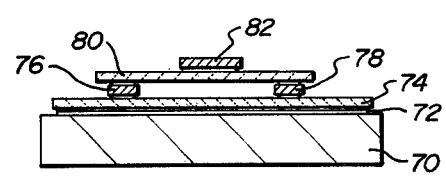
FIG. 9 is a sectional view of an alternate embodiment of the present invention.

FIG. 9 illustrates an alternate packaging embodiment. A metallic heat sink member 70 is bonded by a solder layer 72 to a ceramic body 74 in the same manner previously disclosed. In this embodiment, metallic leads 76 and 78 are directly bonded to conductive patterns on the top of the ceramic body 74. The semiconductor device 80 is then bonded to the tops of the leads 76, and the third lead 82 bonded directly to the top of the semiconductor device 80. In this embodiment, the top lead 80 may be directly bonded to the semiconductor device 80 without the requirement of a third conductive pattern on the ceramic body 74. However, the leads 76 and 78 will tend to impose mechanical stress on the semiconductor device 80, unlike the previously described embodiment.

Figure 10:
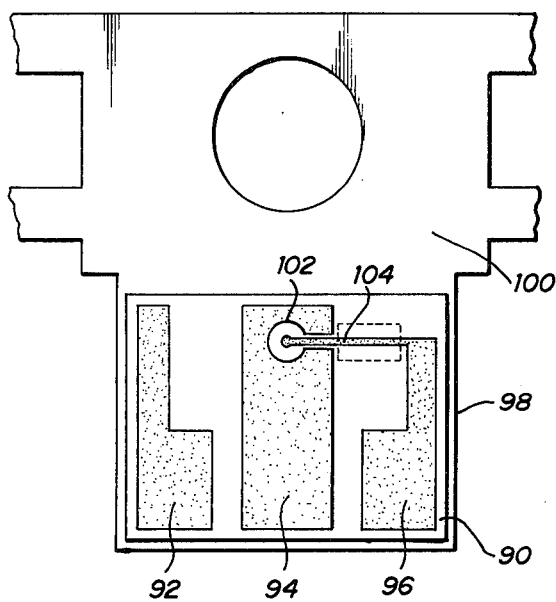
FIG. 10 is a top view of a ceramic body in accordance with another embodiment of the invention.
Figure 11:
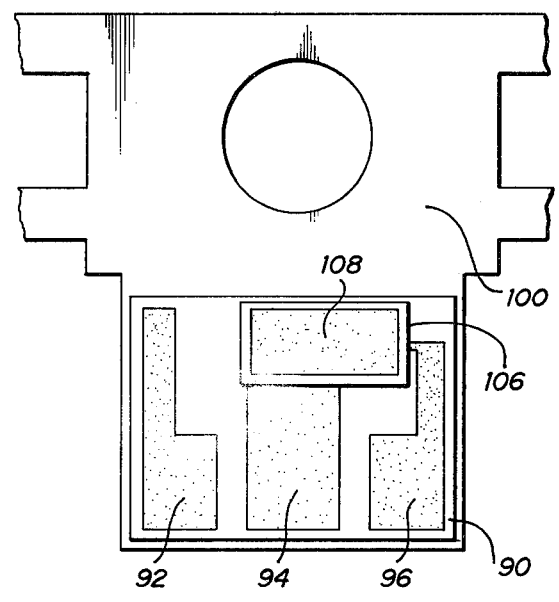
FIG. 11 is a top view of the structure shown in FIG. 10 with the addition of a semiconductor chip.
Figure 12:
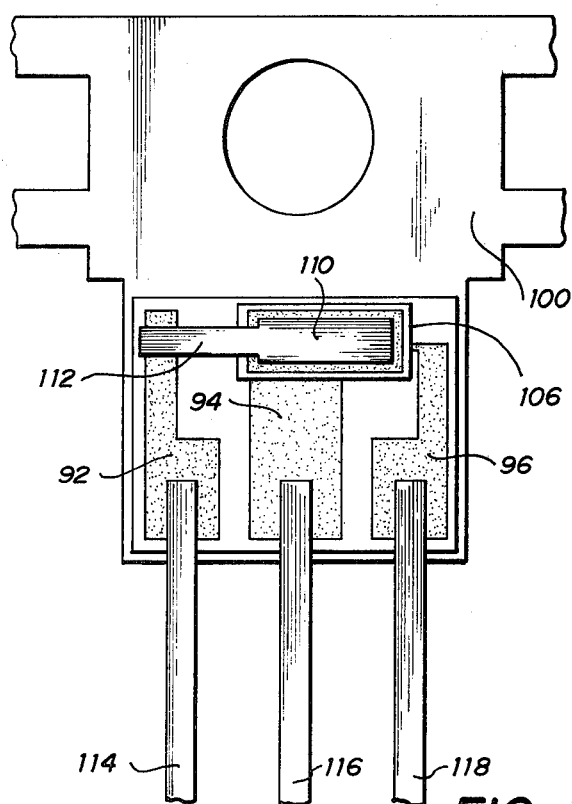
FIG. 12 is a top view of the structure shown in FIG. 11 with the addition of four leads thereto.

FIGS. 10–12 illustrate yet another embodiment wherein a ceramic body 90 includes three conductive patterns 92, 94 and 96 formed thereon. Ceramic body 90 is bonded in the manner previously described to a metal tab 98 extending from a tab frame 100. Conductive pattern 94 includes a cutout portion 102 which receives an elongated projection 104 from pattern 96.

FIG. 11 illustrates the next stage of fabrication of the assembly as illustrated, with like numerals being utilized for like and corresponding parts. The elongated projection 104 is covered by glass or other insulation in the manner previously described. A semiconductor switching device 106 is placed face down into contact with patterns 94 and 96, and bonded thereto. The projection 104 is bonded to the center gate of the device 106, while the pattern 94 is bonded to the first main terminal. The second terminal 108 of the device is shown unconnected at this stage.

FIG. 12 illustrates the subsequent steps of fabrication of the assembly shown in FIGS. 10 and 11. In this embodiment, a metallic lead 110 is bonded at one end to the second main terminal 108 of the semiconductor device 106. The lead 110 is bonded at a reduced area end 112 to conductive pattern 92. Three external leads 114, 116 and 118 are bonded at the ends by soldering or the like to conductive patterns 92, 94 and 96 respectively. Thus, while the embodiment shown in FIGS. 10-12 does not impart mechanical stress from the external leads to the semiconductor device 106, this embodiment does require a fourth lead and requires subsequent additional parts, subsequent additional fabrication processing and utilizes a greater portion of the area of the ceramic member.

Figure 13:
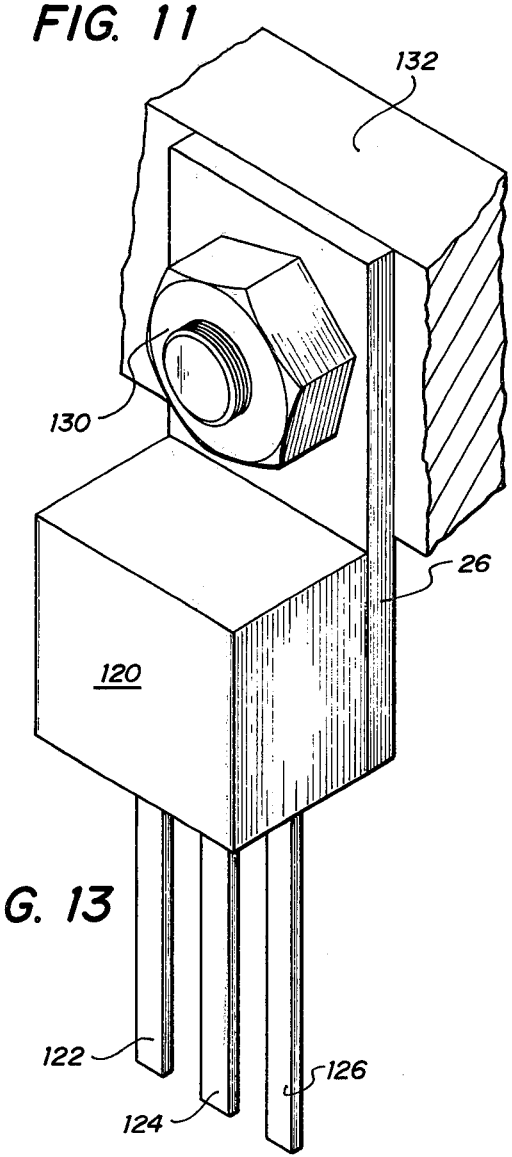
FIG. 13 is a perspective view of a completed semiconductor package in accordance with the present invention attached to a heat sink member.

FIG. 13 illustrates the final packaging of a semiconductor device constructed in accordance with the invention. The tab 26 is trimmed to the desired dimension and the semiconductor device and associated lead circuitry is encapsulated within a housing 120. Housing 120 may comprise suitable epoxy or other fastening material and may include a plastic outer housing if desired. The device thus includes three external leads 122, 124 and 126. If the device is constructed in accordance with the preferred embodiment shown in FIGS. 1–8, mechanical stress imparted upon leads 122 and 126 will not be directly imparted to the semiconductor device within the housing 120. The heat sink tab 26 includes the aperture 28 which may receive a bolt 130 in order to attach the entire device into a heavy sink member 132. It will be seen that the present invention thus provides an economical technique for fabricating a semiconductor package which has a large number of economic and operational advantages.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor device package comprising:
   a metal heat sink support member,
   a ceramic electrical insulating body bonded on a first side to said support member,
   first and second spaced apart interdigitated conductive patterns formed on a second side of said ceramic body,
   a semiconductor switching device having first and second terminal patterns formed on one side and a third terminal pattern on the other side, said switching device being bonded on said one side to said interdigitated conductive patterns with said first and second terminal patterns respectively bonded to and directly contacting said first and second conductive patterns,
   said first conductive pattern including a first lead contact site formed on said second side of said ceramic body and extending beyond a side of said switching device bonded to said conductive patterns and said second conductive pattern including a second lead contact site formed on said second side of said ceramic body and extending beyond a side of said switching device bonded to said conductive patterns,
   a first lead bonded to said first lead contact site and a second lead bonded to said second lead contact site, such that said switching device is isolated from mechanical stresses imposed on said leads, and
   a third lead connected to said third terminal pattern of said switching device and extending from said third terminal outwardly from said ceramic body.

2. The semiconductor device package of claim 1 wherein said third lead extends from said third terminal to a third conductive pattern formed on said ceramic body.

3. The semiconductor device package of claim 1 wherein said semiconductor switching device comprises a center gate device with said first terminal pattern comprising a centrally located gate and said second terminal pattern surrounds said gate, said first and second interdigitated conductive patterns being formed to correspond with said gate and said second terminal.

4. The semiconductor device package of claim 1 wherein said switching device and said leads are bonded by soldering, the solder for bonding said leads to said first and second lead contact sites having a lower melting point than the melting point of the solder for bonding said switching device to said conductive patterns.

5. The semiconductor device package of claim 4 wherein said solder for bonding said switching device is formed from a material selected from the group including gold-germanium, copper-silver bronze, aluminum, platinum, gold, silver and cadmium, in order to reduce thermal fatigue between said ceramic body and said semiconductor switching device.

6. The semiconductor device package of claim 3 wherein said second conductive pattern contacts said second terminal and has a recessed portion for receiving an elongated member of said first conductive pattern and said first elongated member contacts said centrally located gate of said switching device.

7. The semiconductor device package of claim 6 wherein a layer of insulating material is disposed on a portion of said elongated member such that said elongated member is insulated from contacting said second terminal of said switching device.

8. The semiconductor device of claim 1 wherein said third lead is formed from a low expansion alloy and includes a small bend formed near the point said third lead contacts said switching device, so as to reduce the mechanical stresses transmitted by said third lead to said switching device.

9. A semiconductor device package comprising:
a conductive heat sink support member,
an electrically nonconductive body having two opposed planar faces and bonded to said support member at one of said planar faces,
a conductive pattern formed on the other of said planar faces of said body and having at least two discrete pattern portions, and at least two of said pattern portions being interdigitated,
a semiconductor device having at least first and second terminal patterns formed on one side and a third terminal pattern on the other side, said semiconductor device being bonded on said one side to said conductive pattern with said first and second terminal patterns respectively contacting said two discrete portions of said conductive pattern and additional ones of said discrete pattern portions contacting corresponding ones of said additional terminal patterns,
first and second conductive leads bonded to said two discrete portions of said conductive pattern adjacent to said semiconductor device and extending outwardly from said nonconductive body, and
a third conductive lead bonded to said third terminal on the other side of said semiconductor device.

10. The semiconductor device package of claim 9 wherein said semiconductor device comprises a center gate device with said first terminal pattern comprising a centrally located gate and said second terminal pattern surrounds said gate,
said interdigitated conductive patterns being spaced apart to correspond with said gate and said surrounding second terminal pattern.

11. The semiconductor device package of claim 9 wherein said semiconductor device and said leads are bonded to said conductive patterns of said nonconductive body by soldering, the solder for bonding said leads having a lower melting point than the melting point of the solder for bonding said switching device to said conductive patterns.

12. The semiconductor device package of claim 9 wherein said nonconductive body comprises a ceramic substrate,
a molybdenum-manganese bonding layer formed on said ceramic substrate,
at least two unitary discrete copper layers formed on said bond layer to form said conductive pattern, said copper layers each comprising substantially elemental copper so as to provide maximum heat transfer, ductility and conductivity.

13. The semiconductor device package of claim 10 wherein said second conductive pattern contacting said second terminal includes a recessed portion dimensioned to receive an elongated member of said first conductive pattern for contacting said centrally located gate of said switching device.

14. The semiconductor device package of claim 13 wherein a layer of insulating material is disposed on a portion of said elongate member such that said elongate member is insulated from contacting said second terminal of said switching device.

* * * * *